United States Patent
Liu et al.

(10) Patent No.: US 11,978,694 B2
(45) Date of Patent: May 7, 2024

(54) DUAL-SUBSTRATE ANTENNA PACKAGE STRUCTURE AND METHOD FOR MANUFACTURING THE SAME

(71) Applicant: JCET GROUP CO., LTD., Wuxi (CN)

(72) Inventors: Shuo Liu, Wuxi (CN); Chen Xu, Wuxi (CN); Yaojian Lin, Wuxi (CN); Haitao Shi, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 29 days.

(21) Appl. No.: 17/531,728

(22) Filed: Nov. 20, 2021

(65) Prior Publication Data

US 2022/0392831 A1    Dec. 8, 2022

(30) Foreign Application Priority Data

Jun. 7, 2021    (CN) .......................... 202110631223.8

(51) Int. Cl.
*H01L 23/498*    (2006.01)
*H01L 23/58*    (2006.01)

(52) U.S. Cl.
CPC ........ *H01L 23/49816* (2013.01); *H01L 23/58* (2013.01); *H01L 23/49822* (2013.01)

(58) Field of Classification Search
CPC . H01L 23/498; H01L 23/49822; H01L 23/58; H01L 23/49816
USPC .......................................................... 361/781
See application file for complete search history.

(56) References Cited

U.S. PATENT DOCUMENTS

2021/0036413 A1*    2/2021    Kim .................... H01L 23/5385

* cited by examiner

*Primary Examiner* — Tremesha S Willis
(74) *Attorney, Agent, or Firm* — Cheng-Ju Chiang

(57) ABSTRACT

The present invention provides a dual-substrate antenna package structure and a method for manufacturing the same. The package structure includes a main substrate and at least one antenna substrate. The antenna substrate is provided on a pad of the main substrate by an array of solder balls placed on the antenna substrate, at least one chip is electrically connected to the main substrate, and metal wiring provided on the main substrate electrically connects the pad to the chip. The array of solder balls includes support solder balls and conventional solder balls, and the support solder balls have a melting point high than 250° C. A spacing distance between the antenna substrate and the main substrate can be kept stable during the reflow soldering process and subsequent processes because the support solder balls having the high melting point can always maintain the stability of the structure during the reflow soldering process.

9 Claims, 9 Drawing Sheets placing solder balls on an antenna substrate, wherein the solder balls comprise support solder balls and conventional solder balls, and the support solder balls have a melting point higher than 250°C — S1 providing a main substrate on which metal wiring and a pad for forming an electrical connection with the solder balls are formed, electrically connecting at least one chip to the main substrate, and dispensing glue on a surface of the main substrate on which the pad is formed — S2 providing at least one antenna substrate on the main substrate in an aligned manner through the solder balls — S3 performing reflow soldering to solder and fix the antenna substrate to the main substrate — S4

FIG. 9

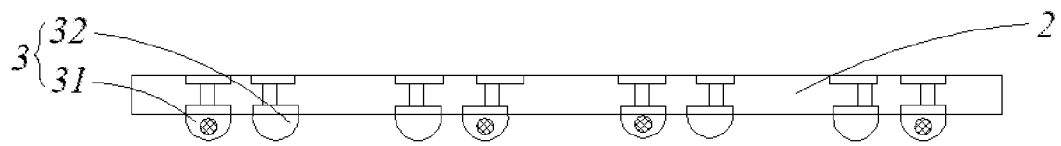

FIG. 10 through holes are opened in the antenna substrate, and solder balls are placed on the antenna substrate, the solder balls include support solder balls and conventional solder balls, and the support solder balls herein have a melting point higher than 250°C — S1a providing a main substrate on which metal wiring and a pad for forming an electrical connection with the solder balls are formed, electrically connecting at least one chip to the main substrate, and dispensing glue on a surface of the main substrate on which the pad is formed — S2 at least one antenna substrate is provided on the main substrate in an aligned manner through the solder balls, and the glue is filled into the through holes and dried to form a colloid for connecting the main substrate 1 and the antenna substrate — S3a performing reflow soldering to solder and fix the antenna substrate to the main substrate — S4

FIG. 13

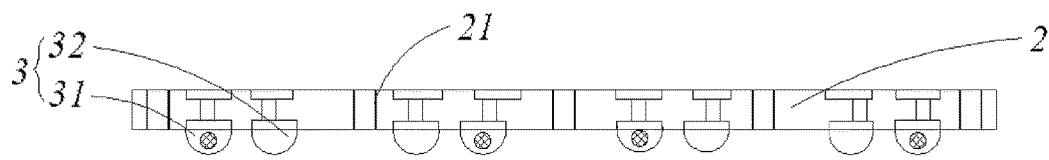

FIG. 14

DUAL-SUBSTRATE ANTENNA PACKAGE STRUCTURE AND METHOD FOR MANUFACTURING THE SAME

TECHNICAL FIELD

The present invention relates to the field of packaging technologies, and in particular to a dual-substrate antenna package structure and a method for manufacturing the same.

BACKGROUND

Antenna-in-Package (AiP), which is a technology more and more widely applied in transmission of millimeter wave bands, is an integrated structure of an integrated circuit and a packaged antenna. Currently, this structure is implemented by stacking two substrates, and the upper and lower substrates are fixed by soldering of solder balls. The upper substrate is a single-band input antenna, the lower substrate is for wiring, a consistent spacing distance is kept between the upper substrate and the lower substrate, and they are always aligned in the plane direction. However, it is difficult to keep the distance between the two substrates stable due to the changes in sizes of solder balls and warpage of the substrates in the manufacturing process.

SUMMARY

An object of the present invention is to provide a dual-substrate antenna package structure and a method for manufacturing the same.

The present invention provides a dual-substrate antenna package structure, which includes a main substrate and at least one antenna substrate. The antenna substrate is provided on a pad of the main substrate by an array of solder balls placed on the antenna substrate, at least one chip is electrically connected to the main substrate, and metal wiring provided on the main substrate electrically connects the pad to the chip. The array of solder balls includes support solder balls and conventional solder balls, and the support solder balls have a melting point higher than 250° C.

As a further improvement of the present invention, the support solder ball is further covered with a layer of solder plating on the surface to form a core ball.

As a further improvement of the present invention, a number ratio of the conventional solder balls to the support solder balls is 1:0.04 to 1:0.1.

As a further improvement of the present invention, the support solder balls are centrosymmetrically distributed on the antenna substrate with a geometric center of the antenna substrate as a center.

As a further improvement of the present invention, there are at least 8 support solder balls, which are disposed at four corner regions and centers of four sides of a center region of the antenna substrate, respectively.

As a further improvement of the present invention, the main substrate further includes a non-functional pad on which the support solder balls are provided, and the non-functional pad is not electrically connected with the metal wiring.

As a further improvement of the present invention, through holes are formed in the antenna substrate and filled with a colloid connected to the main substrate.

As a further improvement of the present invention, a metal layer is provided on an inner wall surface of the through hole.

As a further improvement of the present invention, glue or a plastic package material is filled between the main substrate and the antenna substrate.

The present invention further provides a method for manufacturing a dual-substrate antenna package structure, including:
  placing solder balls on an antenna substrate, wherein the solder balls comprise support solder balls and conventional solder balls, and the support solder balls have a melting point higher than 250° C.;
  providing a main substrate on which metal wiring and a pad for forming an electrical connection with the solder balls are formed, electrically connecting at least one chip to the main substrate, and dispensing glue on a surface of the main substrate on which the pad is formed;
  providing at least one antenna substrate on the main substrate in an aligned manner through the solder balls; and
  performing reflow soldering to solder and fix the antenna substrate to the main substrate.

As a further improvement of the present invention, the support solder ball is further covered with a layer of solder plating on the surface to form a core ball.

As a further improvement of the present invention, placing the solder balls on the antenna substrate specifically includes:
  placing conventional solder balls and the support solder balls on the substrate in a number ratio of 1:0.04 to 1:0.1.

As a further improvement of the present invention, placing the solder balls on the antenna substrate specifically includes:
  placing, on the antenna substrate, the support solder balls that are distributed centrosymmetrically with a geometric center of the antenna substrate as a center.

As a further improvement of the present invention, placing the solder balls on the antenna substrate specifically includes:
  placing at least eight solder balls at four corner regions and centers of four sides of a center region of the antenna substrate respectively.

As a further improvement of the present invention, the method further includes:
  providing a plurality of non-functional pads on the main substrate, and disposing the support solder balls on the non-functional pads, wherein the non-functional pads are not electrically connected to the metal wiring.

As a further improvement of the present invention, the method further includes:
  opening through holes in the antenna substrate prior to providing at least one antenna substrate on the main substrate in an aligned manner through the solder balls; and
  providing, prior to the reflow soldering, the antenna substrate on the main substrate, filling the through hole with glue, and performing drying to form a colloid for connecting the main substrate and the antenna substrate.

As a further improvement of the present invention, the method further includes:
  performing plating on an inner wall surface of the through hole to form a metal layer.

As a further improvement of the present invention, the method further includes:
  performing plastic packaging by filling glue or a plastic package material between the main substrate and the antenna substrate after soldering and fixing the antenna substrate to the main substrate.

The present invention has following beneficial effects. Due to the combination of the conventional solder balls and the support solder balls, the spacing distance between the antenna substrate and the main substrate can be kept stable during the reflow soldering process and subsequent processes because the support solder balls having the high melting point can always maintain the stability of the structure during the reflow soldering process.

BRIEF DESCRIPTION OF THE DRAWINGS

FIG. 9 is a schematic flowchart of a method for manufacturing a dual-substrate antenna package structure according to Embodiment 5 of the present invention;

FIGS. 10 to 12 are schematic flowcharts of respective steps in the method for manufacturing the dual-substrate antenna package structure according to Embodiment 5 of the present invention;

FIG. 13 is a schematic flowchart of a method for manufacturing a dual-substrate antenna package structure according to Embodiment 6 of the present invention; and FIGS. 14 to 15 are schematic flowcharts of some steps in the method for manufacturing the dual-substrate antenna package structure according to Embodiment 5 of the present invention.

DETAILED DESCRIPTION

Figure 1:
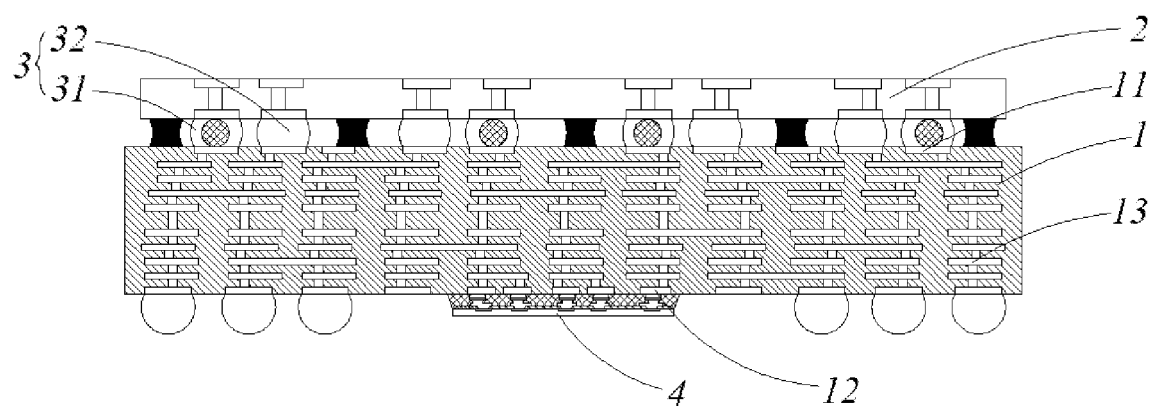
FIG. 1 is a schematic diagram of a dual-substrate antenna package structure according to Embodiment 1 of the present invention.

In order to make the purpose, technical solutions, and advantages of the present application clearer, the technical solutions of the present application will be clearly and completely described below in conjunction with the specific embodiments of the present application and the corresponding drawings. Obviously, the described embodiments are only a part of the embodiments of the present application, rather than all of the embodiments. Based on the embodiments in present invention, all other embodiments obtained by those of ordinary skill in the art without creative work shall fall within the protection scope of the present invention.

The following describes the embodiments of the present invention in detail. Examples of the embodiments are shown in the accompanying drawings, in which the same or similar reference numerals indicate the same or similar elements or elements with the same or similar functions through the whole text. The following embodiments described with reference to the accompanying drawings are exemplary, and are only used to explain the present invention, but should not be understood as limiting the same.

For the convenience of description, this application uses terms representing the relative positions in space for description, such as "upper", "lower", "rear", "front", etc., which are used to describe the relationship of one unit or feature shown in the drawings relative to another unit or feature. The terms describing the relative positions in space may include different orientations of the equipment in use or operation other than the orientations shown in the drawings. For example, if a device in the drawings is turned over, the unit described as being "below" or "above" other units or features will be positioned "above" or "below" the other units or features. Therefore, the exemplary term "below" can encompass both spatial orientations of below and above.

Figure 2:
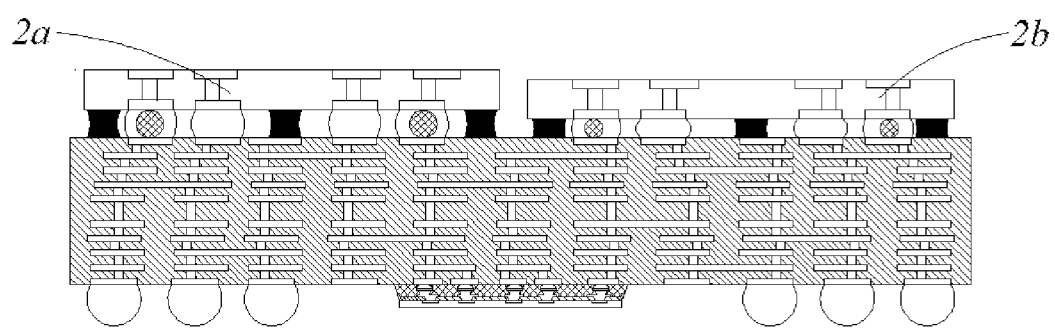
FIG. 2 is a schematic diagram of a dual-substrate antenna package structure according to Embodiment 2 of the present invention.
Figure 3:
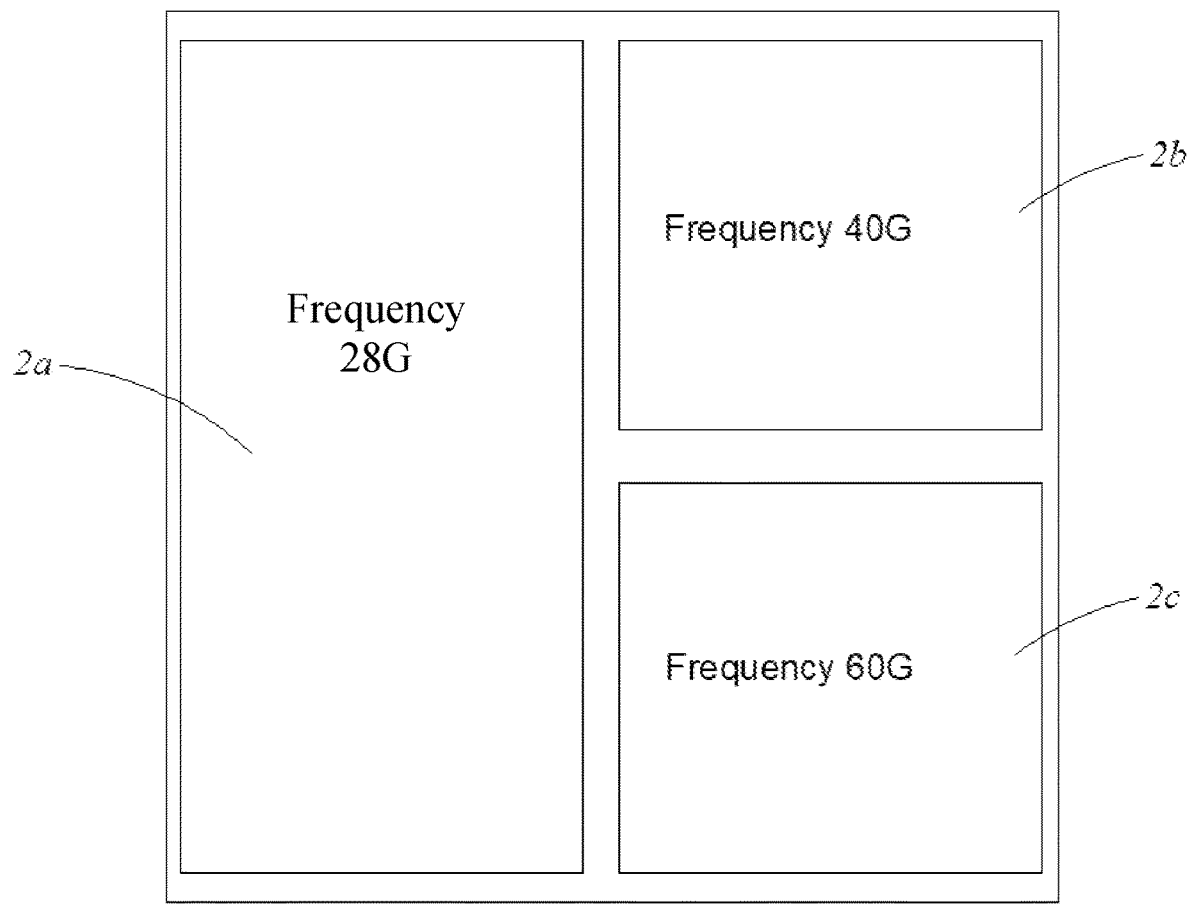
FIG. 3 is a top view of the dual-substrate antenna package structure according to Embodiment 2 of the present invention.

As shown in FIGS. 1 to 3, the present invention provides a dual-substrate antenna package structure, which includes a main substrate 1 and at least one antenna substrate 2. The main substrate 1 has a first surface and a second surface that are opposite to each other, the antenna substrate 2 is provided on the first surface of the main substrate 1 via solder balls 3 placed on the antenna substrate 2, and at least one chip 4 is electrically connected to the main substrate 1.

The main substrate 1 has the first surface and the second surface that are opposite to each other. In this embodiment, a first pad 11 for forming an electrical connection with an array of solder balls 3 is provided on the first surface of the main substrate 1, and a second pad 12 for forming an electrical connection with a chip and an external metal bump is provided on the second surface. The chip 4 is provided on the second surface of the substrate, and metal wiring 13 is provided in the main substrate 1 to form an electrical connection between the first pad 11 and the second pad 12. In other embodiments of the present invention, the chip 4 may also be embedded in the substrate, or stacked with the antenna substrate 2 on the same side of the main substrate 1, which is not specifically limited in the present invention.

The antenna substrate 2 includes antenna patterns, wiring lines and the like provided on the substrate, and each antenna substrate 2 constitutes a single-band input antenna. According to needs in designing the antenna, a plurality of antenna substrates 2 applied to different frequency bands may be provided on the main substrate 1 to improve the integration degree of the antenna package structure, such that the antenna package structure is more suitable for integrated millimeter wave antenna technologies characterized in large-scale multiple-input and multiple-output.

As shown in FIG. 1, in Embodiment 1, an antenna substrate 2 is provided on the main substrate 1, which is suitable for a frequency band of 28 GHz.

As shown in FIG. 2 and FIG. 3, in Embodiment 2, a first antenna substrate 2a, a second antenna substrate 2b and a third antenna substrate 2c are provided on the main substrate 1, and are suitable for frequency bands of 28 GHz, 40 GHz and 60 GHz, respectively. The three frequency bands above are the most promising frequency bands for 5G communication, and are more suitable for integrated millimeter wave antenna technologies characterized in large-scale multiple-input and multiple-output by integrating these three frequency bands in a package structure. The distances between the main substrate 1 and the first antenna substrate 2a, the second antenna substrate 2b and the third antenna substrate 2c are individually controlled according to needs in designing the antenna substrate 2 of different frequency bands.

The antenna substrate 2 is fixedly connected to and electrically conductive with the main substrate 1 by the array of solder balls 3 placed on the antenna substrate 2, and the array of solder balls 3 includes support solder balls 31 and conventional solder balls 32.

The conventional solder balls 32 are tin balls widely adopted in the prior art, and are generally an alloy composed mainly of tin, silver and copper. The conventional solder balls 32 are adopted in the package structure for electrically and mechanically connecting different electronic devices, and are heated and melted during the reflow soldering process to be soldered and fixed to the first pad 11.

The melting point of the support solder balls 31 is higher than 250° C., which means that the support solder balls 31 are not melted during the conventional reflow soldering process and may keep the stability of the structure, such that the spacing distance between the antenna substrate 2 and the main substrate 1 remains stable during the reflow soldering process and subsequent processes.

The support solder balls 31 may be tin balls having a high melting point, and may have a higher melting point than conventional tin balls by adjusting the alloy components and the content of each component. In the present invention, the tin balls having a melting point higher than 250° C. are selected to ensure that the tin balls having the high melting point to keep the structural size stable in the reflow soldering process.

In some embodiments of the present invention, the surface of the support solder ball 31 is further covered with a layer of solder plating to constitute a core ball that is a solder ball 3 having a composite multilayer structure. The support solder balls 31 are of copper cores or plastic cores, and have a melting point much higher than 250° C. The support solder balls 31 may keep the structural size stable, thereby have a more stable structure compared with the tin balls having the high melting point during the reflow soldering process, but have a higher cost.

In some embodiments of the present invention, the tin balls having the high melting point and the core balls may be used in combination according to the needs in design. The core balls are used at some of the most stressed positions, and the tin balls having the high melting point are adopted at the remaining positions where the support solder balls 31 shall be provided, such that the production cost can be reduced while ensuring the stability of the dual-substrate structure.

Further, a non-functional first pad (not shown) may be further provided at some positions of the antenna substrate 2 and the main substrate 1, and the support solder balls 31 may be provided on the non-functional first pad and merely function as a structural support rather than a structure for electrical connection. Due to the composite structure, the core ball may be susceptible to dummy soldering during the reflow soldering process, and thereby merely acts as a structural support member, such that there is no need to supplement tin when the core ball has defects such as dummy soldering in the reflow soldering process due to its composite structure.

The number ratio of the conventional solder balls 32 to the support solder balls 31 is 1:0.04 to 1:0.1. The production cost can be reduced by controlling the number of the support solder balls 31 in the array of solder balls 3, and the alignment offset between the antenna substrate 2 and the main substrate 1 in the plane direction can be controlled by using the self-alignment effect of the conventional solder balls 32.

Further, the support solder balls 31 are distributed centrosymmetrically on the antenna substrate 2 with the geometric center of the antenna substrate 2 as a center, such that the structural stability between the antenna substrate 2 and the main substrate 1 can be further ensured to thereby prevent the antenna substrate 2 from having local collapse.

Further, there are at least 8 support solder balls 31, which are disposed at four corner regions and centers of four sides of the center region of the antenna substrate, respectively.

Figure 4:
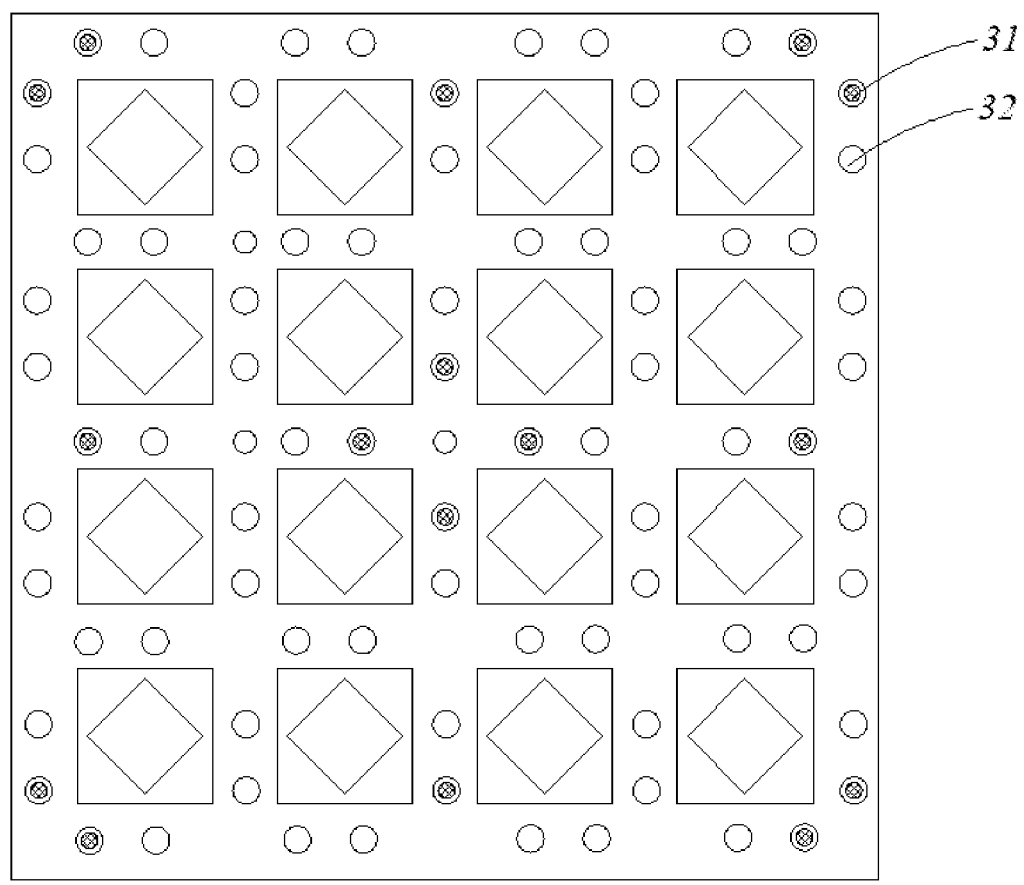
FIG. 4 is a schematic diagram of distribution of solder balls on an antenna substrate in the dual-substrate antenna package structure according to Embodiment 1 of the present invention.

Exemplarily, as shown in FIG. 4, in Embodiment 1, two support solder balls 31 are provided at each of the four corners of the antenna substrate 2, one support solder ball 31 is provided at the center of each of the four sides of the center region of the antenna substrate 2, and one support solder ball 31 is provided at the center of each of the four sides of the antenna substrate 2 adjacent to the edges.

Figure 5:
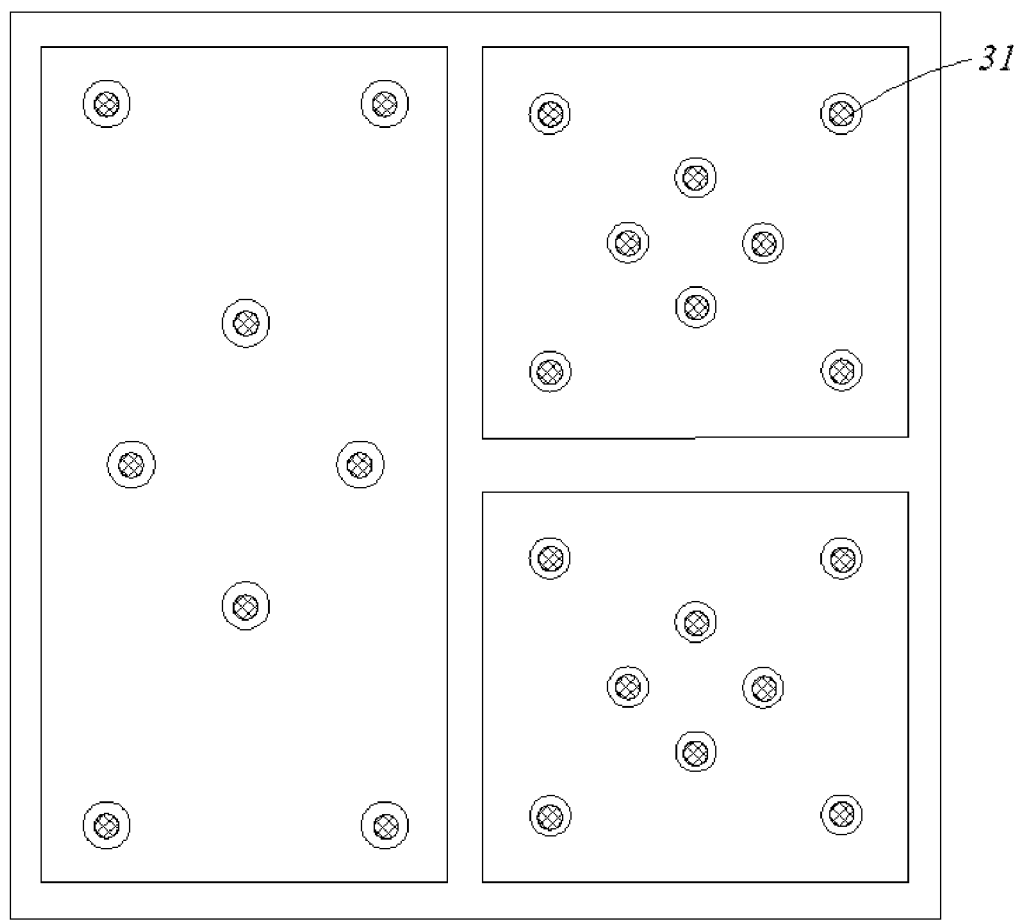
FIG. 5 is a schematic diagram of distribution of solder balls on an antenna substrate in the dual-substrate antenna package structure according to Embodiment 2 of the present invention (omitting conventional solder balls)

As shown in FIG. 5, in Embodiment 2, one support solder ball 31 is provided at each of the four corner regions and centers of the four sides of the center region of each of the first antenna substrate 2a, the second antenna substrate 2b, and the third antenna substrate 2 (the conventional solder balls are omitted in FIG. 5).

In some embodiments of the present invention, through holes 21 are further formed in the antenna substrate 2, and are filled with a colloid 5 connected to the main substrate 1.

Figure 6:
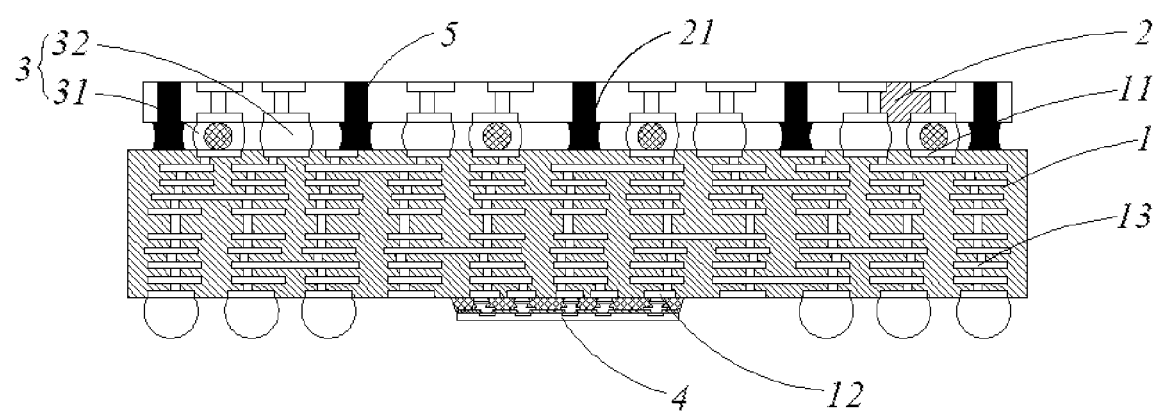
FIG. 6 is a schematic diagram of a dual-substrate antenna package structure according to Embodiment 3 of the present invention.
Figure 7:
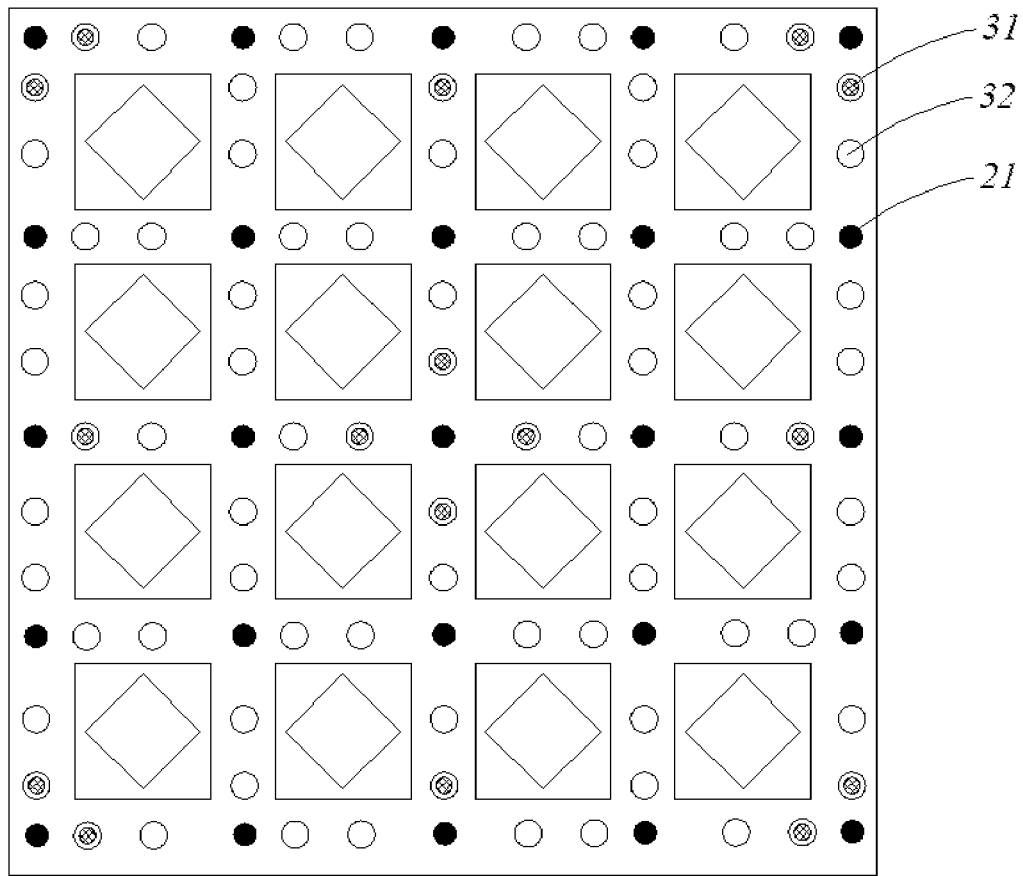
FIG. 7 is a schematic diagram of distribution of solder balls on an antenna substrate in the dual-substrate antenna package structure according to Embodiment 3 of the present invention.

Exemplarily, as shown in FIGS. 6 and 7, in Embodiment 3, based on Embodiment 1, a plurality of through holes 21 are formed and evenly distributed on the antenna substrate 2 at intervals. By opening the through holes 21 in the antenna substrate 2, the internal stress of the antenna substrate 2 can be reduced, and the warpage of the antenna substrate 2 in the manufacturing process can be reduced. On the basis that the change in the spacing distance between substrates caused by external factors can be solved by the support solder ball 31, the change in the spacing distance between substrates brought by the antenna substrate 2 per se can be solved by opening the through holes 21, such that the stability of the spacing distance between substrates can be ensured from two dimensions. Further, by filling the through holes 21 with glue and performing drying to form the colloid 5, the spacing distance between the antenna substrate 2 and the main substrate 1 can be easily controlled in the manufacturing process.

Further, a metal layer is provided on an inner wall surface of the through hole 21. The effect of shielding electromagnetic signals is achieved by forming the metal layer.

In other embodiments of the present invention, the through holes 21 may be provided on a plurality of antenna substrates 2, which will not be repeated here.

Figure 8:
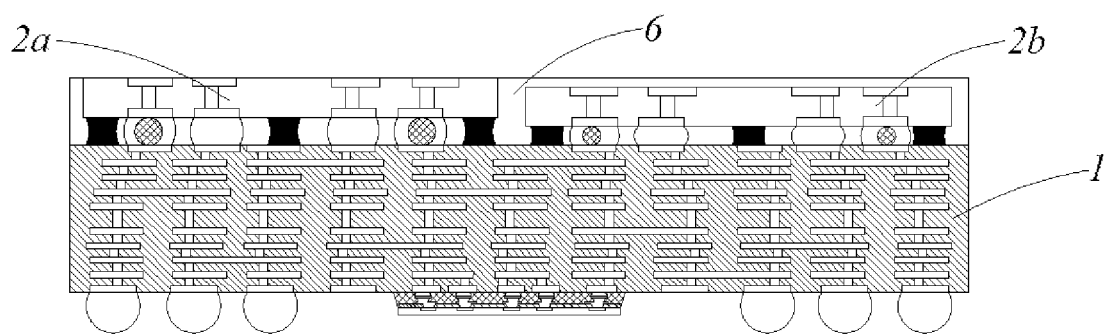
FIG. 8 is a schematic diagram of a dual-substrate antenna package structure according to Embodiment 4 of the present invention.

Glue or a plastic package material may be filled between the main substrate 1 and the antenna substrate 2 according to different needs to thereby provide the protection. In Embodiment 1 and Embodiment 3, the glue is filled between the substrates, and as shown in FIG. 8, in Embodiment 4, the plastic package layer 6 covers the main substrate 1 and the antenna substrate 2.

The present invention further provides a method for manufacturing a dual-substrate antenna package structure, and as shown in FIG. 9, in Embodiment 5, the method includes following steps.

In step S1, as shown in FIG. 10, solder balls 3 are placed on an antenna substrate 2, wherein the solder balls 3 include support solder balls 31 and conventional solder balls 32, and the support solder balls 31 have a melting point higher than 250° C.

The support solder balls 31 may be tin balls having a melting point or core balls. Each core ball has a core portion and at least one layer of solder plating covering the core portion, and the core portion has a melting point higher than 250° C.

Further, the conventional solder balls 32 and the support solder balls 31 are placed on the substrate in a number ratio ranging from 1:0.04 to 1:0.1.

Further, the support solder balls 31 are placed on the antenna substrate 2 and distributed centrosymmetrically with a geometric center of the antenna substrate 2 as a center.

Further, at least eight solder balls 3 are placed in the four corner regions and in centers of four sides of the antenna substrate 2 respectively.

Figure 11:
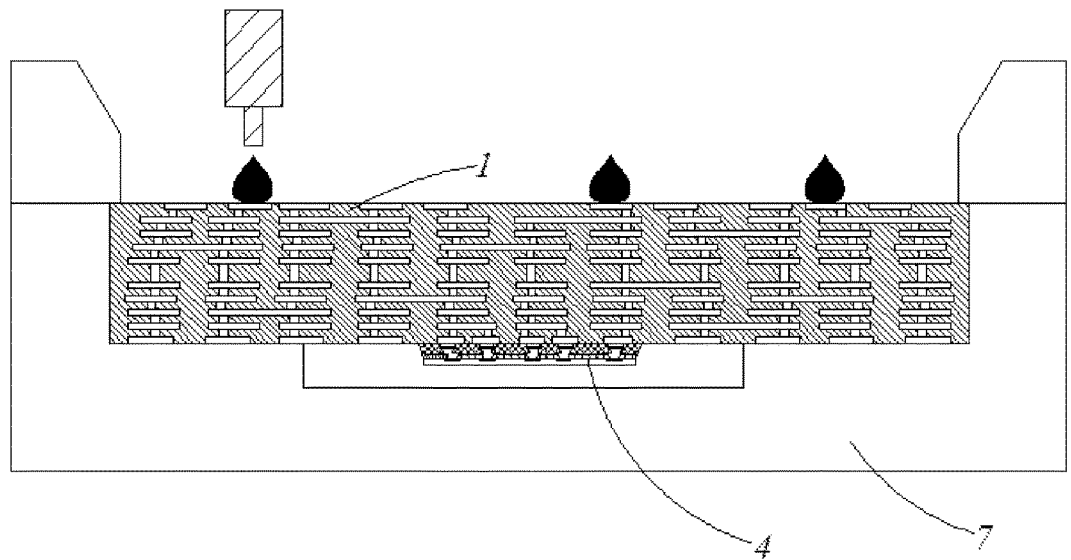

In step S2, as shown in FIG. 11, a main substrate 1 is provided, metal wiring 13 and a first pad 11 for forming an electrical connection with the solder balls 3 are formed on the main substrate 1, and at least one chip 4 is electrically connected to the main substrate 1. Then, the main substrate 1 is placed in a jig 7, and glue is dispensed on the surface of the main substrate 1 where the first pad 11 is formed.

During the process of dispensing the glue, the glue is controlled to maintain at a certain height stably and does not flow randomly.

Further, in some embodiments of the present invention, a plurality of non-functional first pads that are not electrically connected to the metal wiring 13 are further provided on the main substrate 1, and the support solder balls 31 are provided on the non-functional first pads in the subsequent process.

Figure 12:
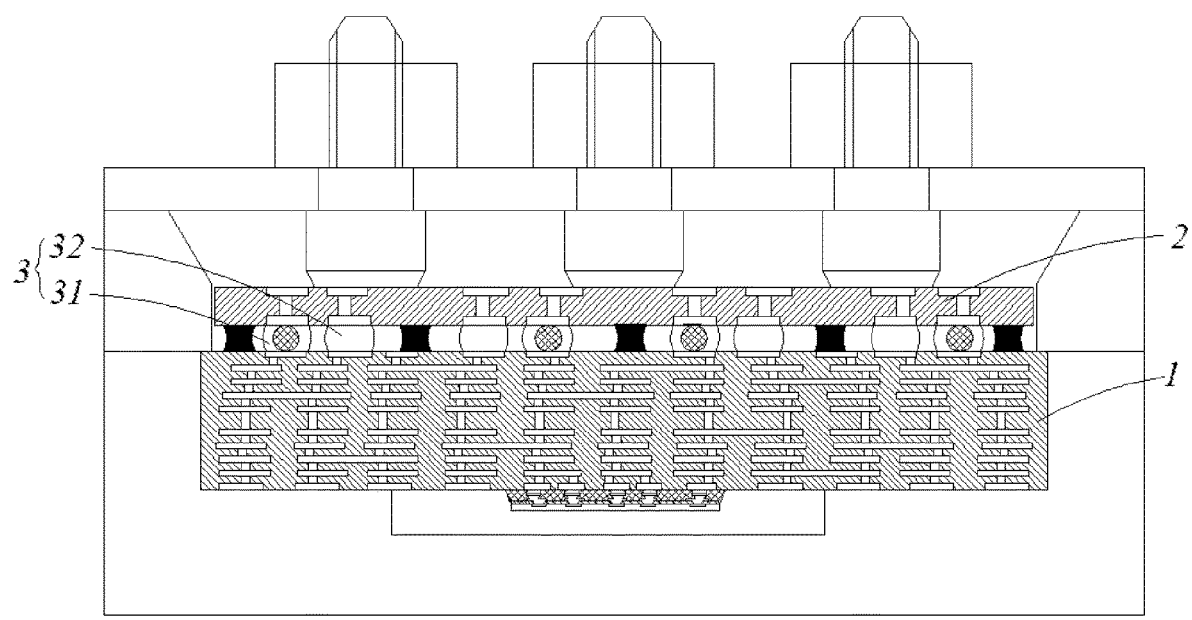

In step S3, as shown in FIG. 12, at least one antenna substrate 2 is provided on the main substrate 1 in an aligned manner through the solder balls 3.

After the antenna substrate 2 is mounted on the main substrate 1, the spacing distance between the antenna substrate 2 and the main substrate 1 is adjusted by adjusting the pressure of the jig 7 on the antenna substrate 2.

When there are a plurality of antenna substrates 2, the pressure exerted by the jig 7 on different antenna substrates 2 is controlled separately to adjust the different spacing distances between the antenna substrates 2 and the main substrate 1.

In step S4, the reflow soldering is performed to solder and fix the antenna substrate 2 to the main substrate 1.

After the antenna substrate 2 is soldered and fixed to the main substrate 1, the glue and the plastic package material is filled between the main substrate 1 and the antenna substrate 2 for performing the plastic package.

In some embodiments of the present invention, the method further includes providing through holes 21 in the antenna substrate 2, which as shown in FIG. 13, includes following steps in Embodiment 6.

In step S1a, as shown in FIG. 14, through holes 21 are opened in the antenna substrate 2, and solder balls 3 are placed on the antenna substrate 2. The solder balls 3 include support solder balls 31 and conventional solder balls 32, and the support solder balls 31 herein have a melting point higher than 250° C.

The through holes 21 may be formed by laser or mechanical cutting.

Further, plating may be performed on an inner wall surface of the through hole 21 to form a metal layer.

In step S2, a main substrate 1 is provided, metal wiring 13 and a first pad 11 for forming an electrical connection with the solder balls 3 are formed on the main substrate 1, and at least one chip 4 is electrically connected to the main substrate 1. Then, the main substrate 1 is placed in the jig 7, and glue is dispensed on the surface of the main substrate 1 where the first pad 11 is formed.

Figure 15:
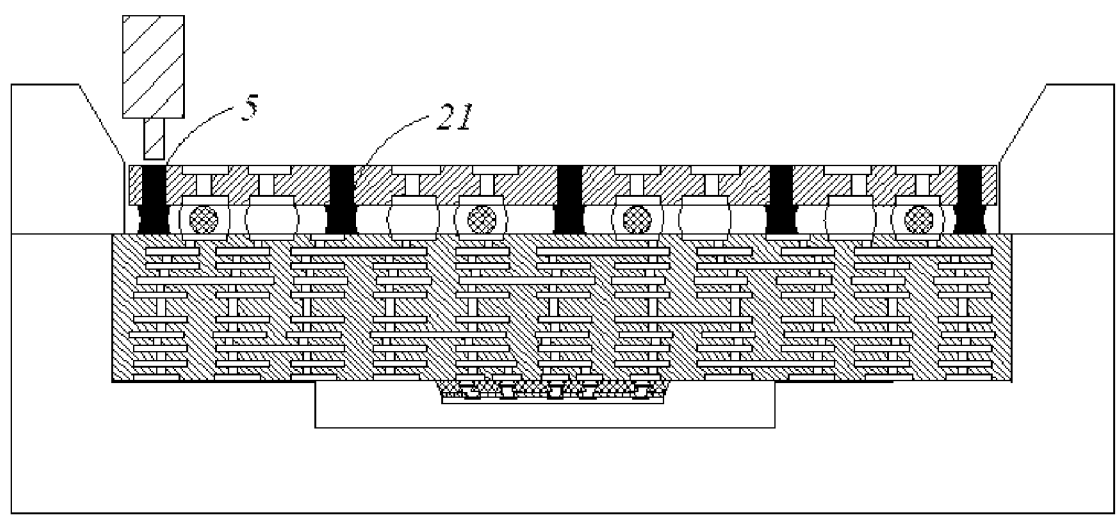

In step S3a, as shown in FIG. 15, at least one antenna substrate 2 is provided on the main substrate 1 in an aligned manner through the solder balls 3, and the glue is filled into the through holes 21 and dried to form a colloid 5 for connecting the main substrate 1 and the antenna substrate 2.

In the process of filling the glue, the glue is controlled to stay stable between the antenna substrate 2 and the main substrate 1 and then dried to maintain the spacing distance between the antenna substrate 2 and the main substrate 1. The glue as dispensed here, if having no need for electrical connection, may be optionally non-conductive glue and preferably be low-fluidity glue.

In step S4, the reflow soldering is performed to solder and fix the antenna substrate 2 to the main substrate 1.

In summary, in the present invention, due to the combination of the conventional solder balls and the support solder balls, the spacing distance between the antenna substrate and the main substrate can be kept stable during the reflow soldering process and subsequent processes because the support solder balls having the high melting point can always maintain the stability of the structure during the reflow soldering process.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustration listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A method for manufacturing a dual-substrate antenna package structure, comprising:
   placing solder balls on an antenna substrate, wherein the solder balls comprise support solder balls and conventional solder balls, the conventional solder balls are heated and melted during a conventional reflow soldering process to be soldered and fixed to corresponding pads, and the support solder balls have a melting point higher than 250° C. and are not melted during the conventional reflow soldering process;
   providing a main substrate on which a metal wiring and the corresponding pads for forming an electrical connection with the conventional solder balls are formed, electrically connecting at least one chip to the main substrate, and dispensing glue on a surface of the main substrate on which the corresponding pads are formed;
   providing at least one of the antenna substrate on the main substrate in an aligned manner through the solder balls; and
   performing reflow soldering to solder and fix the antenna substrate to the main substrate.

2. The method for manufacturing the dual-substrate antenna package structure according to claim 1, wherein the support solder ball is further covered with a layer of solder plating on the surface to form a core ball.

3. The method for manufacturing the dual-substrate antenna package structure according to claim 1, wherein the step of "placing the solder balls on the antenna substrate" specifically comprises:

placing the conventional solder balls and the support solder balls on the antenna substrate in a number ratio of 1:0.04 to 1:0.1.

4. The method for manufacturing the dual-substrate antenna package structure according to claim 3, wherein the step of "placing the solder balls on the antenna substrate" specifically comprises:

placing, on the antenna substrate, the support solder balls that are distributed centrosymmetrically with a geometric center of the antenna substrate as a center.

5. The method for manufacturing the dual-substrate antenna package structure according to claim 4, wherein the step of "placing the solder balls on the antenna substrate" specifically comprises:

placing at least eight solder balls in four corner regions and centers of four sides of a center region of the antenna substrate respectively.

6. The method for manufacturing the dual-substrate antenna package structure according to claim 1, further comprising:

providing a plurality of non-functional pads on the main substrate, and disposing the support solder balls on the non-functional pads, wherein the non-functional pads are not electrically connected to the metal wiring.

7. The method for manufacturing the dual-substrate antenna package structure according to claim 1, further comprising:

opening through holes in the antenna substrate prior to the step of "providing at least one of the antenna substrate on the main substrate in an aligned manner through the solder balls"; and providing, prior to the reflow soldering, the antenna substrate on the main substrate, filling the through hole with glue, and performing drying to form a colloid for connecting the main substrate and the antenna substrate.

8. The method for manufacturing the dual-substrate antenna package structure according to claim 7, further comprising:

performing plating on an inner wall surface of each of the through holes to form a metal layer.

9. The method for manufacturing the dual-substrate antenna package structure according to claim 1, further comprising:

performing plastic packaging by filling glue or a plastic package material between the main substrate and the antenna substrate after soldering and fixing the antenna substrate to the main substrate.

* * * * *